United States Patent [19]

Hynecek

[11] Patent Number: 5,402,459

[45] Date of Patent: Mar. 28, 1995

[54] FRAME TRANSFER IMAGE SENSOR WITH ELECTRONIC SHUTTER

[75] Inventor: Jaroslav Hynecek, Richardson, Tex.

[73] Assignee: Texas Instruments Incorporated, Dallas, Tex.

[21] Appl. No.: 60,192

[22] Filed: May 10, 1993

[51] Int. Cl.$^6$ .................. G11C 19/28; H01L 29/796
[52] U.S. Cl. .................. 377/58; 257/217; 257/223; 257/229; 257/230; 257/231; 257/247
[58] Field of Search .......... 377/58, 61; 257/217, 257/221–224, 229, 230, 231, 247

[56] References Cited

U.S. PATENT DOCUMENTS

| | | |
|---|---|---|
| 4,229,752 | 10/1980 | Hynecek . |
| 4,245,164 | 1/1981 | Funahashi ............... 257/224 |
| 4,649,407 | 3/1987 | Kitamura et al. ........ 257/247 |
| 4,660,090 | 4/1987 | Hynecek ................. 377/58 |
| 4,673,963 | 6/1987 | Hynecek ................. 377/58 |
| 4,679,212 | 7/1987 | Hynecek ................. 377/58 |
| 4,733,406 | 3/1988 | Kinoshita ................ 377/61 |
| 4,742,381 | 3/1988 | Fujii ..................... 257/247 |
| 4,995,061 | 2/1991 | Hynecek ................. 377/58 |
| 5,151,380 | 9/1992 | Hynecek . |

OTHER PUBLICATIONS

*Electron–Hole Recombination Antiblooming for Virtual Phase CCD Imager*, Jaroslav Hynecek, *IEEE Transactions on Electron Devices*, vol. ED-30, No.8, Aug. 1983.

*Primary Examiner*—Gene M. Munson
*Attorney, Agent, or Firm*—Alan K. Stewart; Richard L. Donaldson; William E. Hiller

[57] ABSTRACT

An image sensing device with electronic shutter having a semiconductor substrate of a first conductivity type and a buried channel layer of a second conductivity type disposed on the substrate. Virtual phase electrodes in the buried channel layer having the first conductivity type form virtual gate potential areas in the substrate below the virtual phase electrodes. An insulating layer is formed on the substrate. Conductive electrodes disposed on the insulating layer and located over portions of the substrate between the virtual phase electrodes form clocked gate potential areas in the substrate below the conductive electrodes. The virtual gate potential areas and the clocked gate potential areas form charge transfer columns along which charge can be transferred to an end of the charge transfer column. A fast charge transfer mode wherein every other conductive electrode in a charge transfer column is clocked out of phase from the other conductive electrodes provides fast charge transfer through the charge transfer column.

16 Claims, 4 Drawing Sheets

FRAME TRANSFER IMAGE SENSOR WITH ELECTRONIC SHUTTER

FIELD OF THE INVENTION

This invention relates generally to a method and apparatus for providing an improved image sensor device having an electronic shutter. The method and apparatus disclosed is applicable to circuits, integrated circuits and systems wherein observation, capture or detection of image information is required.

BACKGROUND OF THE INVENTION

Without limiting the scope of the invention, its background is described in connection with a frame transfer device for image sensing, in particular a charge coupled device array for image sensing.

In a typical frame transfer device technology, it is difficult to create a device with an electronic shutter because the time of transfer of the captured data into a memory area is longer than the interval available, that is the time interval equal to the horizontal blanking interval. It is desirable to use a frame transfer device in these applications because the frame transfer CCD's (charge coupled devices) are advantageous to the currently used interline devices in many ways, including the simplicity of the construction, higher resolution, and higher sensitivity than corresponding interline transfer devices.

For example, in the standard video application using the NTSC standards, it is has been observed that a prior art frame transfer CCD arrangement having a 244 line image sensing array, a memory for holding the last captured data, and a serial output register for outputting the line data is best utilized if the array is not disturbed during the horizontal line readout time, because disturbing the sensing array tends to produce interfering signals at the output. This means that the only time available to clear the sensing array and therefore provide for an electronic shutter effect is during the horizontal blanking period. This time is limited by the NTSC standard to approximately 10 microseconds. Because the frame transfer devices of the prior art must be cleared by clocking the charge through each line, the time interval is not long enough to accomplish this goal. The clearing must wait until the longer vertical blanking period. This occurs less frequently, every 1/60 second, which makes an electronic shutter effect difficult to design within the standard.

It is therefore desirable to incorporate an electronic shutter capability into a frame transfer CCD device, for use in image sensing applications currently being implemented by use of conventional interline transfer devices. Accordingly, improvements which overcome any or all of the above discussed problems are presently desirable.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
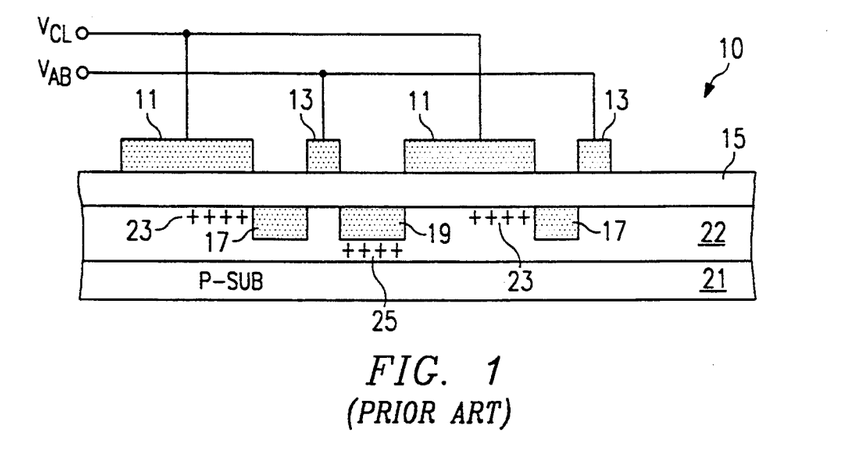
FIG. 1 is a cross sectional view of a conventional pixel area in a virtual phase CCD charge transfer device of the prior art.

FIG. 1 depicts a virtual phase CCD device of the prior art having single phase clocking and antiblooming gate features. A description of the basic virtual phase CCD device is described in Applicant's U.S. Pat. No. 4,229,752 filed Oct. 21 1980, "Virtual Phase Charge Transfer Device", herein incorporated by reference. A description of the anti-blooming gate feature and the operation of the charge transfer device depicted in FIG. 1 is completely described in Applicant's U.S. Pat. No. 4,679,212 filed Jul. 7, 1987 and entitled "Method and Apparatus for Using Surface Trap Recombination in Solid State Imaging Devices", also herein incorporated by reference.

In FIG. 1, the virtual phase CCD device 10 of the prior art is illustrated. The charge transfer device is shown in cross-section along a charge transfer channel. Gate electrodes 11 are provided in each pixel area, overlying oxide layer 15 and a p-type substrate 21. Polysilicon gates 11 are fabricated over an oxide layer 15 of a predetermined thickness, which is overlying p-type substrate 21 which also includes an N type buried channel layer 22. Doping concentrations 23 and 25 are used to create virtual gate areas 17 and 19, which together comprise a virtual phase region of the virtual phase CCD device. Antiblooming gate 13 is constructed within the virtual gate comprised of virtual gate areas 17 and 19. The potential profile created by the use of doping concentrations 23 and 25 and virtual gate regions 17 and 19 is designed so that a clocked gate barrier region having a first potential is created under gate electrodes 11, and a higher potential clocked gate well is created underneath the doping concentration region 23. These potentials will vary with the voltage applied at gate electrode 11. The potential under virtual gate 17 is designed to create a fixed potential virtual barrier region, and the virtual gate 19 combined with the doping concentration region 25 creates a virtual well adjacent the antiblooming gate region.

In operation, gates 11 are clocked by a potential applied at signal input $V_{CL}$. From the prior art, it will be understood that a clocked barrier region is formed under the left portion of gate electrodes 11, that a clocked well is formed under the right portion of gate electrodes 11 by implanting dopants 23 illustrated by the "+" symbols to produce a potential well which is lower than the potential in the clocked barrier region. It is known that as the voltage on signal line $V_{CL}$ is raised and lowered, the clocked potential barrier and wells underneath gate electrodes 11 will also be raised and lowered. A virtual gate is implemented encompassing the areas 17 and 19 in the figure. These areas are produced by forming P+ regions 17 and 19 in the p-type substrate 21 including the N type buried channel layer 22. Area 17 forms a virtual barrier and area 19, combined with the dopant region 25, forms a virtual well.

Anti-blooming or over flow charge reduction gates 13 are formed within the virtual gate region which encompasses regions 17 and 19 of the figure. The operation of the antiblooming gate within the virtual gate region is readily understood from Applicant's U.S. Pat. No. 4,679,212, incorporated by reference above, and Applicant's article entitled "Electron Hole Recombination Antiblooming for Virtual Phase CCD Imager", IEEE Transactions on Electron Devices, Vol. ED-30, No. 8, August 1983 at pp. 941. During the integration of charge in the pixel area of the image sensing charge transfer device of FIG. 1, a clocking signal is applied to gates 13.

Figure 2:
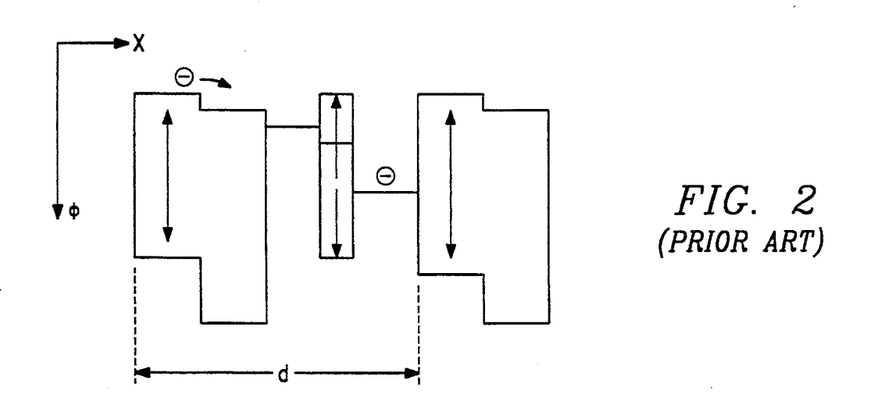
FIG. 2 is a potential diagram illustrating the operation of the device in FIG. 1 in moving charge from a first pixel area to an adjacent second pixel area.

In FIG. 2, a potential profile diagram is used to depict the operation of the charge transfer device of FIG. 1. During the first charge transfer stage, clock line $V_{CL}$ is held at a high potential, causing the potential underneath gate electrodes 11 to follow and move higher. As the pixel area is exposed to photon energy, generated charge collects in the clocked well underneath region 23, as this has a higher potential than the adjacent virtual well and clocked barrier regions. Once charge is collected in the clocked well area 23 underneath gate electrode 11, a low voltage is applied to the input $V_{CL}$ which causes the potential underneath the gate electrode 11 to move lower. The clocked well region 23 is then at a lower potential than the virtual barrier and virtual well regions. This causes the electrons to move from the clocked well region to the virtual barrier region and then into the virtual well region 25 underneath virtual gate 19. The electrons cannot move into the next pixel area because the potential underneath gate electrode 11 is now forming a clocked barrier, stopping the transfer. This is necessary to preserve the identity of charge pockets collected in each pixel area, associated with each gate 11.

Distance "d" in FIG. 2 represents the lateral distance the charge collected in a pixel area can be transferred in a single clock cycle on the signal input $V_{CL}$. The distance "d" is also a limitation on the speed with which the pixel areas can be cleared of charge. In order to remove the charge from a column of "N" pixel areas, the voltage input VcL must be clocked up and down through "N" cycles. The charge stored under the gate 11 at the left side of FIG. 3 will be transferred across the areas created by virtual gate 17, antiblooming gate 13, and virtual gate 19, where the transfer will end. When the voltage level $V_{CL}$ is moved to a high level, the charge can move into the potential well underneath the adjacent gate 11 at the right of the figure. Distance d indicates the lateral distance charge can be moved in a single clock cycle using the virtual phase technology of the prior art as depicted in FIG. 1.

In sensing images by frame transfer devices, it is desirable that the frame transfer rate be such that the frame transfer can occur faster than the horizontal blanking interval of approximately 10 microseconds. The fast frame transfer is necessary for implementing the electronic shutter. The shutter is desirable because the shutter is required to limit accumulated charge in certain applications, such as small frame format CCD cameras and imaging devices for use with an NTSC standard video system, wherein the integration time is relatively long, so that unwanted charge is accumulated between vertical blanking periods.

Figure 3:
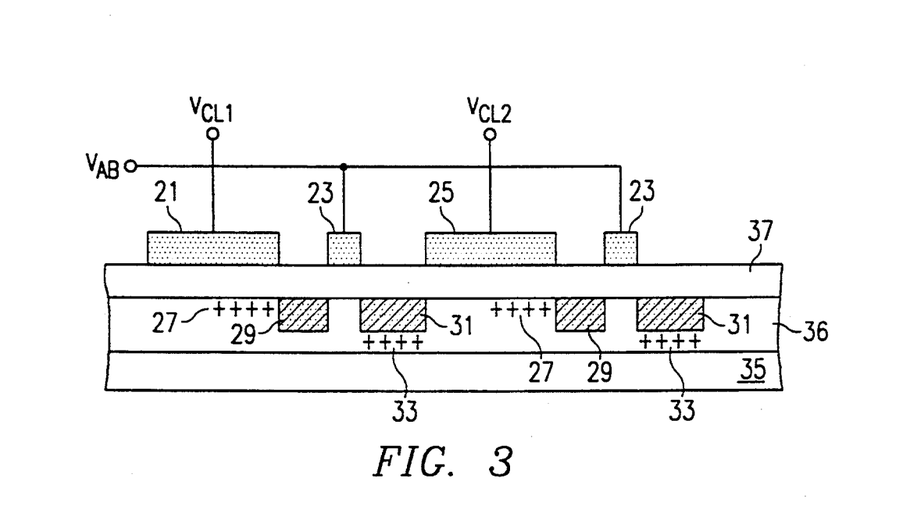
FIG. 3 is a cross sectional view of a first preferred embodiment of the frame transfer image sensor with electronic shutter.

In FIG. 3, an improved virtual phase CCD device with electronic shutter according to the invention is depicted. P type substrate 35 which includes N type buried channel layer 36 has oxide layer 37 and polysilicon gate electrodes 21, 23, and 25 deposited on it. Virtual gate regions 29 and 31 are formed at the surface of P type substrate 35, the virtual gate regions 29 and 31 begin comprised of P+ material which is deposited through well known photolithography techniques of the art. Similarly, dopant concentrations 27 and 33 are deposited within P type substrate 35. Gate electrode 21 is coupled to a first clock voltage $V_{CL1}$, while gate electrode 25 is coupled to a second clock voltage $V_{CL2}$. The potential profile of the device is controlled by the doping impurities concentrations 27 and 33, and the virtual gate regions 29 and 31, to produce a profile that contains a clocked gate barrier region under gate 21, a clocked gate well under dopant concentration 27, a virtual phase barrier under virtual gate 29, and a virtual phase well produced by the combination of virtual gate 31 and dopant concentration 33. The potential profile repeats starting at gate electrode 25, and is symmetrical, however gate electrode 25 is controlled by a separate clocking voltage $V_{CL2}$. The separate control of gate electrode 25 is most important in gaining the advantages of the invention herein described.

In operation, the adjacent pixel areas associated with gates 21 and 25 are operated in two modes. In charge transfer to memory operations, the adjacent pixel areas are clocked in phase, so that charge is transferred from one pixel area to the next on each clock cycle. During charge clearing operations, the adjacent pixel areas are instead operated out of phase. This allows charge to be cleared from the clocked potential wells at a substantially faster rate, as will be described below.

Figure 4A:
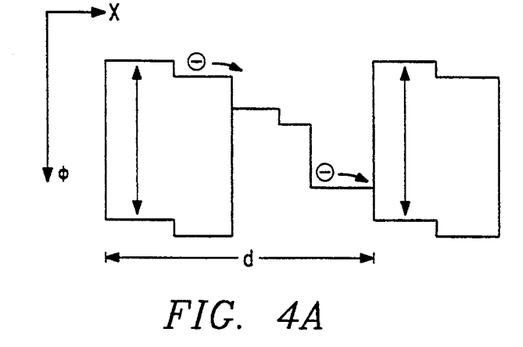
FIG. 4A is a potential diagram illustrating the operation of the device in FIG. 3 in the charge transfer to memory mode.
Figure 4B:
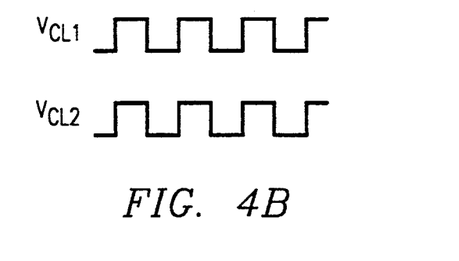
FIG. 4B is a waveform diagram illustrating the clocking signals applied to the device of FIG. 3 for the charge transfer to memory mode.

FIG. 4A depicts the potential profiles for the in phase clocking operation. This profile operates to move charge exactly as the prior art single clock input devices described in applicant's U.S. Pat. No. 4,679,212, referred to above. FIG. 4B depicts the clocking waveforms applied to gates 21 and 25 during the in phase clocking operation for transferring sensed charge from one pixel area to an adjacent pixel area.

During the in phase clocking operation, adjacent pixel areas associated with gates 21 and 25 are clocked on separate voltage gate controls, $V_{CL1}$ controlling gate 21, and $V_{CL2}$ controlling the gate 25. $V_{AB}$ controls the antiblooming gates 23, this gate is held at a steady intermediate potential during both the charge transfer to memory operation and the charge clearing operation. In transferring the charge accumulated in the clocked well regions during image sensing operation, the gates 21 and 25 are clocked together, that is the voltages at $V_{CL1}$ and $V_{CL2}$ are clocked in phase, as shown in FIG. 4B. FIG. 4A depicts how the potential profile is used to move the collected charge. When voltages $V_{CL1}$ and $V_{CL2}$ are at a low potential, charge collected in the clocked gate well regions underneath dopant concentrations 27 are at a lower potential than the adjacent virtual barrier regions located underneath virtual gates 29. This causes the charge to move to the right in FIG. 3. When the charge reaches the virtual barrier region, it is at a lower potential than the region underneath the antiblooming gates 23 and moves to the right again. Now the charge is at a lower potential than the virtual well region underneath the virtual gate regions 31 and moves to the virtual well. At this point the charge is trapped in the virtual well regions because it is at a higher potential than the adjacent clocked barrier regions underneath gate 25. Thus in one clock cycle of the voltages $V_{CL1}$ and $V_{CL2}$ the charge can move from a clocked well region to the virtual well region of a single pixel area. The voltages $V_{CL1}$ and $V_{CL2}$ are then moved to a high level. The charge collected in the virtual well regions is now at a lower potential than the adjacent clocked barrier regions underneath gates 21 and 25, and so moves into the clocked barrier and then the clocked well regions, where the charge will remain until the clocking voltages $V_{CL1}$ and $V_{CL2}$ are again moved to a low level. Note that for the in phase operation, the distance the charge can move in a single clock cycle is distance d shown in FIG. 4A, and that this distance is exactly the same as for the prior art virtual phase CCD devices.

Figure 5A:
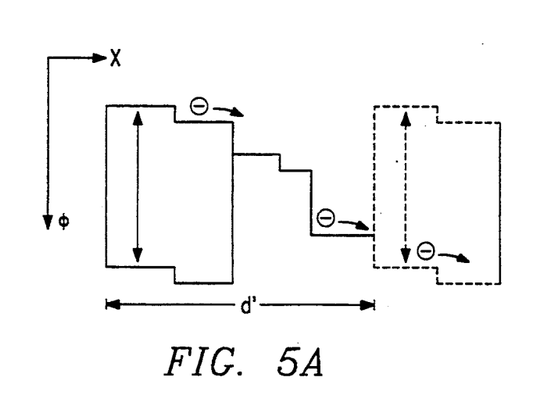
FIG. 5A is a potential diagram illustrating the operation of the device in FIG. 3 in the charge clearing mode.
Figure 5B:
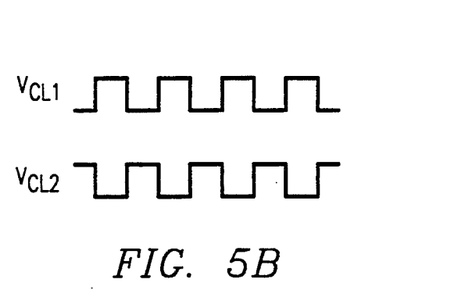
FIG. 5B is a waveform diagram illustrating the clocking signals applied to the device of FIG. 3 for the charge clearing mode.

When it is desired to clear the image sensing pixel area of charge, the charge accumulated in the cells is to be discarded. The improved virtual phase CCD device of the invention takes advantage of this fact. FIG. 5A depicts the potential profiles for the pixel areas of FIG. 3 for out of phase clocking operations. FIG. 5B depicts the waveforms applied at gates 21 and 25 by means of signals $V_{CL1}$ and $V_{CL2}$ during out of phase clocking. Initially, the charge moves from the clocked well regions beneath the gate electrode 21 to the virtual well regions beneath virtual gate 31 just as before. However, the charge is now at a lower potential than the adjacent clocked barrier region underneath gate electrode 25. This is because the voltage applied to gate 25 is now out of phase with the voltage applied to gate electrode 21, so that the clocked barrier region beneath gate electrode 25 is at a higher potential than the virtual well region beneath virtual gate 31. Thus the charge moves the distance d' before the voltages $V_{CL1}$ and $V_{CL2}$ are clocked, or in one half of a clock cycle. The charge stored in the pixel area associated with gate electrode 25 is now combined with the charge from the virtual well associated with the virtual gate 31, so information is being lost in the process, but as the clearing operation is intended to discard the charge, this is of no importance. The result is that an image sensing array constructed with the improved virtual parse CCD devices of the invention and clocked out of phase during charge clearing operations as shown in FIG. 5A and FIG. 5B can be cleared in one half the time it takes to clear a similar image sensing array using the virtual phase CCD devices of the prior art.

It has been determined that when fabricating an image sensing device for a ¼ inch frame format using the NTSC standard mode of operation, it is possible by using the improved virtual phase CCD device and clocking scheme of the invention, to clear the array during the horizontal blanking time of approximately 10 microseconds. This enables an electronic shutter capability which was previously unavailable with frame transfer format devices. Now the array can be updated and cleared each time a horizontal blanking time occurs, so that, under bright light conditions, smear and oversensing are reduced.

Figure 6:
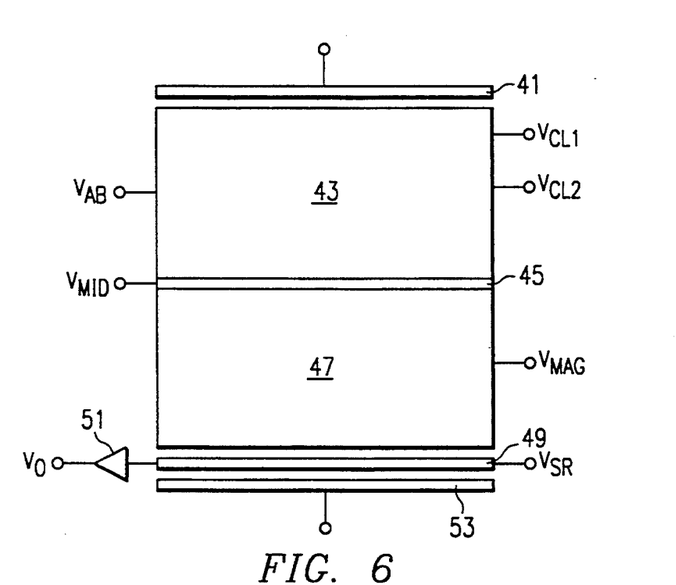
FIG. 6 is a topographical layout of a circuit incorporating the device of FIG. 3 and the mid dump drain circuitry of the invention, and having a memory area and a serial output area for transfering the sensed charge data output.

FIG. 6 depicts a topographical view of an image sensing device fabricated using the improved virtual phase CCD devices of FIG. 3 in the image sensing area. The device is comprised of top drain region 41, split phase image sensing area 43, middle dump drain area 45, memory array area 47, serial register 49, charge detection amplifier 51, and bottom drain 53.

The split phase image sensing area 43 is coupled to the three clock signals of FIG. 3, $V_{AB}$, which goes to the antiblooming gate of each pixel area, and clocking voltages $V_{CL1}$ and $V_{CL2}$, which are coupled to the gate electrodes of alternating rows of pixel areas. By using the in-phase clocking of FIG. 5, charge sensed during an integration period can be transferred down columns at the standard rate. During charge clearing operations, the charge is moved at twice the rate down the columns by use of the out of phase clocking scheme depicted in FIG. 5B.

Middle dump drain 45 is used during charge clearing operations to remove the excess charge without effecting the memory area array. When charge clearing operations are desired, a low potential is applied to the memory area gate $V_{MAG}$ to create a potential barrier so that as the charge arrives from the bottom row of pixel areas in image sensing area 43, the charge is removed through the N+ electrodes coupled to the reference voltage signal $V_{MID}$. During charge transfer operations, charge is transferred from the image area array to the memory area array, by clocking the memory area gates out of phase with the last image area gate.

Memory area 47 may be fabricated with the virtual phase CCD devices described herein and clocked in phase, although the virtual phase devices described in applicant's U.S. Pat. No. 4,229,752, and entitled "Virtual Phase Charge Transfer Device", issued Oct. 21, 1980 and incorporated herein by reference will work perhaps more efficiently, as the memory phase area is not exposed to incident light and it is therefore unnecessary to provide either the charge clearing mechanism or the antiblooming gate mechanism to the devices in this area.

Serial register 49, shown in FIG. 6, operates similarly to a column of the devices in memory area 43. The charge is moved from column to column instead of from row to row. This is accomplished by setting up a potential profile that channels the charge from one pixel area to an adjacent pixel area to the left of the first pixel area.

In the preferred ¼ inch frame transfer device embodiment of the invention, there are 243 rows of pixels. The middle dump drain pixel is designed so that in the charge transfer mode, it merely transfers charge to the clocked barrier of the memory and the charge is not stored in the virtual well of this pixel.

In operation, a sensed image is transferred from the image sensing array 43 to the memory area array 47 during the vertical blanking period. In the preferred embodiment which meets the NTSC standard, it is required that this transfer is not longer than approximately one millisecond. Once the vertical blanking period ends, the image sensing area 43 is placed in integration mode. It is also possible that during extremely short integration times it is possible that image clearing, integration, and transfer to memory can all be accomplished in the vertical blanking period. The voltages $V_{CL1}$ and $V_{CL2}$ are left at low levels, and the antiblooming feature of the virtual phase CCD cells of the image array 43 is exercised by clocking the $V_{AB}$ gates during the integration period. The serial register 49 receives a single row of charge from the memory array gates, which is transferred out by clocking the voltage $V_{SR}$ to shift the charge to the charge detection amplifier 51. In the serial register 49 of FIG. 6, charge is transferred from the right side to the left side responsive to the clocking of voltage input $V_{SR}$. Once the horizontal update is completed, a new row is clocked into the serial register 49, and the image sensing array 43 can be cleared of charge, if desired, using the fast transfer, out of phase, clocking method described above, coupled with the application of a low voltage to the memory area gate $V_{MAG}$ to force the excess charge into the mid dump drain 45. During the next horizontal line update, additional charge will be sensed by the image sensing array 43, so that there is always enough image data in the image sensing array 43, but at the same time no overexposure occurs due to an overlong integration period. The image integration time can now be varied by selecting in which horizontal blanking period the image is cleared.

The cycle continues until the entire memory array gate area has been transferred, one row at a time, to the serial register 49 and shifted out through the charge detection amplifier 51. A vertical blanking period will now occur, which permits the transfer of less than 1/60 second integrated image data from the image sensing area into the memory area.

Figure 7:
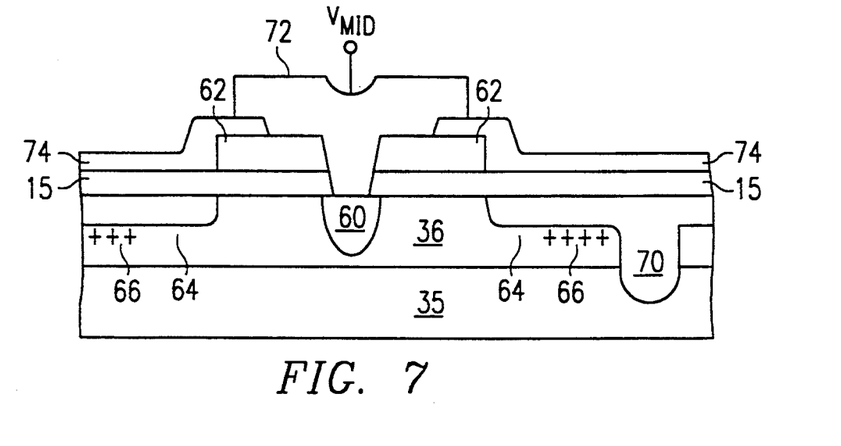
FIG. 7 is a cross sectional view of the mid dump drain.
Figure 8:
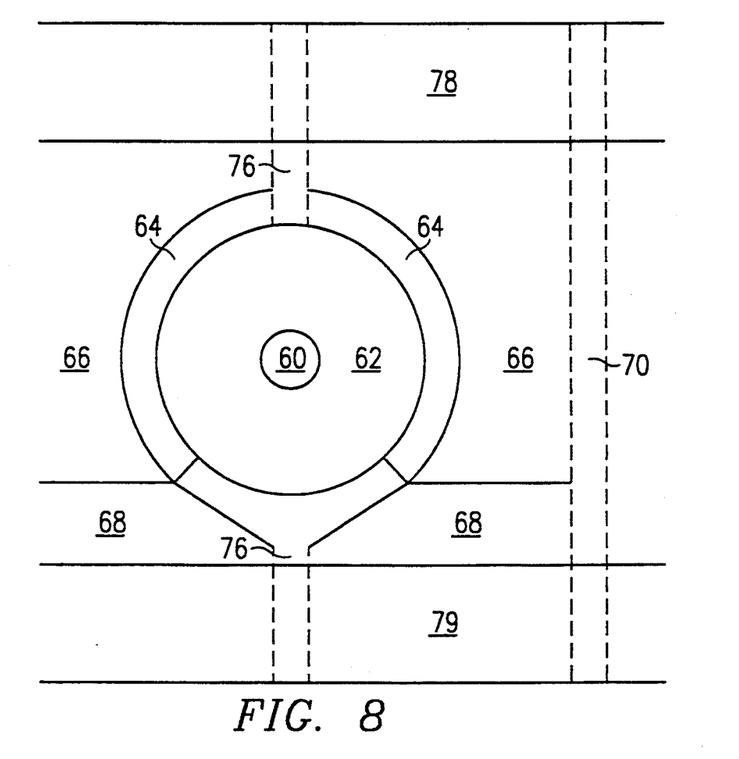
FIG. 8 is a plan view of the mid dump drain.

FIG. 7 depicts a cross sectional view of the mid dump drain region. This cross section is perpendicular to the direction of charge transfer. The mid dump drain region includes an N+ region 60 connected to the $V_{MID}$ electrode in FIG. 6, polysilicon layer 62, which separates the N+ drain from the P+ virtual gate electrode is also connected to the $V_{MID}$ electrode, virtual barrier 64, and virtual well 66, oxide layers 15 and 74, conductive contact 72, and P+ isolation trench 70 which separates the charge transfer columns. In reference to FIG. 8 which is plan view of the mid dump drain region, the mid dump drain region also contains a virtual barrier region 68. A memory area gate 78, the last image area gate 79, and P+ isolation trench 76 are also shown in FIG. 8. The virtual well region 66 is designed to be smaller than the virtual well regions in the memory area array and the image area array. This is important to prevent charge overflow into the memory area array when the memory gate is biased high.

In charge transfer operations, the region between the image sensor array and the memory array operates as a virtual barrier 68 and virtual well 66 allowing charge to flow from the sensor array 43 to the memory array 47. The charge transfer to memory operation is activated by clocking the memory area gate out of phase with the last image area gate. During charge transfer to memory, charge in the virtual well 66 between the sensor array 43 and the memory array 47 is isolated from the mid dump drain by the virtual barrier 64.

During the charge clearing operation of the image sensing array 43, charge flowing from the sensor array 43 overflows the virtual barrier 64 and flows into the drain 60. The overflow is activated by a low voltage applied to the memory area gate $V_{MAG}$. This creates a potential barrier which blocks charge from entering the memory array 47.

Figure 9:
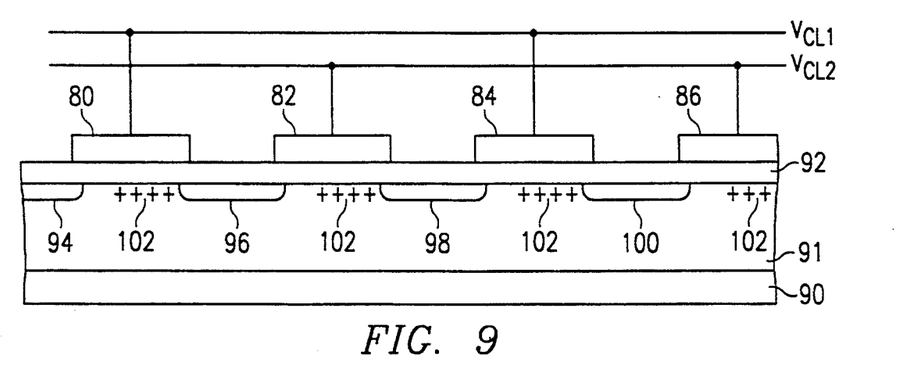
FIG. 9 is a cross sectional view of a second preferred embodiment of the frame transfer image sensor with electronic shutter.

FIG. 9 depicts a second preferred embodiment of the virtual phase CCD device of the invention. FIG. 9 is a cross-sectional view of two adjacent pixel areas cut along the direction of charge transfer. In FIG. 9 P type substrate 90 including N type buried layer 91 has oxide layer 92 (insulator) deposited on it. Polysilicon gate electrodes 80, 82, 84, and 86 are deposited on the oxide layer 92. Virtual gate regions 94, 96, 98, 100 are formed at the surface of P type substrate 90. The virtual gate regions 94, 96, 98, and 100 are comprised of P+ material which is deposited through well known photolithography techniques of the art. Similarly, dopant concentrations 102 are deposited within P type substrate 90. Gate electrodes 80 and 84 are coupled to a first clock voltage $V_{CL1}$, while gate electrodes 82 and 86 are coupled to a second clock voltage $V_{CL2}$. The potential profile of the device is controlled by the doping impurities concentrations 102, and the virtual gate regions 94, 96, 98, and 100, to produce a profile that contains clocked gate barrier regions under gates 80, 82, 84, and 86, clocked gate wells under dopant concentrations 102, and virtual phase wells under virtual gates 94, 96, 98, and 100.

In this second preferred embodiment, alternating gate electrodes 80, 82, 84, and 86 are clocked on $V_{CL1}$ and $V_{CL2}$ respectively. Unlike the embodiment disclosed in FIG. 3, there are no antiblooming gates in this embodiment. The gate electrodes 80, 82, 84, and 86 are used to perform the antiblooming operation. Gate electrode voltages $V_{CL1}$ and $V_{CL2}$ are operated out of phase during both charge transfer to memory and charge clearing modes.

Figure 10:
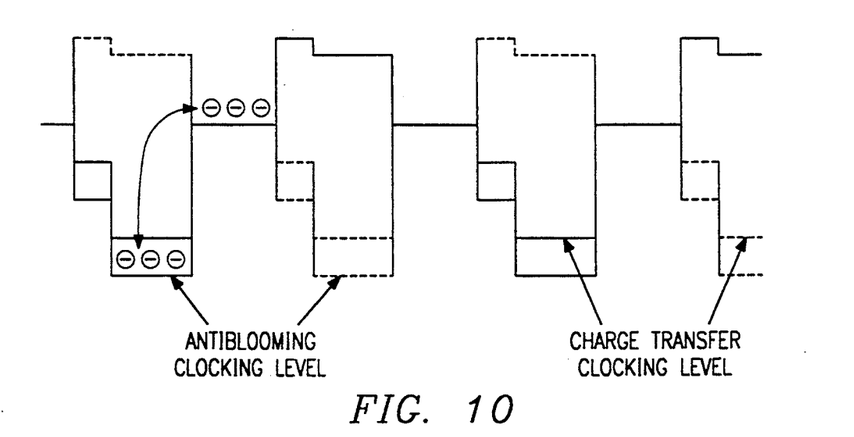
FIG. 10 is a potential diagram illustrating the operation of the device in FIG. 9.

FIG. 10 depicts a potential profile of the pixel areas depicted in FIG. 9. When $V_{CL1}$ and $V_{CL2}$ are at a high and low potential, respectively, charge moves from the clocked well regions underneath gate electrodes 80 and 84 to the clocked wells underneath the oppositely biased gate electrodes 82 and 86, respectively, which is clocked by voltage $V_{CL2}$. Thus this embodiment takes advantage of the out of phase clocking and fast transfer mode of the embodiment of FIG. 3.

During integration time, the operation of the embodiment of FIG. 9 is different from the operation of the embodiment of FIG. 3. Since the anti-blooming gate has been removed, it is necessary to cause the antiblooming effect to occur differently. This is done by holding one of the two voltages $V_{CL1}$ or $V_{CL2}$ at a low potential while the other voltage is clocked high and low. Collected charge from two pixel areas will then be alternated between the virtual wells and the clocked wells underneath clocked gates with alternating voltages. The substrate doping and the N type buried channel doping of the device are selected such that if the voltage $V_{CL1}$ or $V_{CL2}$ is clocked positive enough, the well capacity of the clocked electrode will be reduced and the collected charge will eventually start to reach the interface. This will result in charge recombination with interface holes, exactly as described for the devices with anti-blooming gates in U.S. Pat. No. 4,679,212, incorporated above.

The sensor in the second preferred embodiment in FIG. 9 is operated in interlace mode. During each integration period the roles of $V_{CL1}$ and $V_{CL2}$ are reversed from that of the previous integration period. This causes a pixel centroid shift which provides the required interlace mode.

In this second preferred embodiment, the antiblooming gate has been eliminated and only a split gate structure is necessary. Both interlace and antiblooming capability together with the electronic shutter capability have been preserved. By implementing an array with twice the number of rows of pixels, alternating rows being clocked on $V_{CL1}$ and $V_{CL2}$ respectively, it is possible to eliminate the anti-blooming gate while maintaining the antiblooming feature. Also, this embodiment has an advantage of being smaller and achieving higher pixel integration density.

Figure 11:
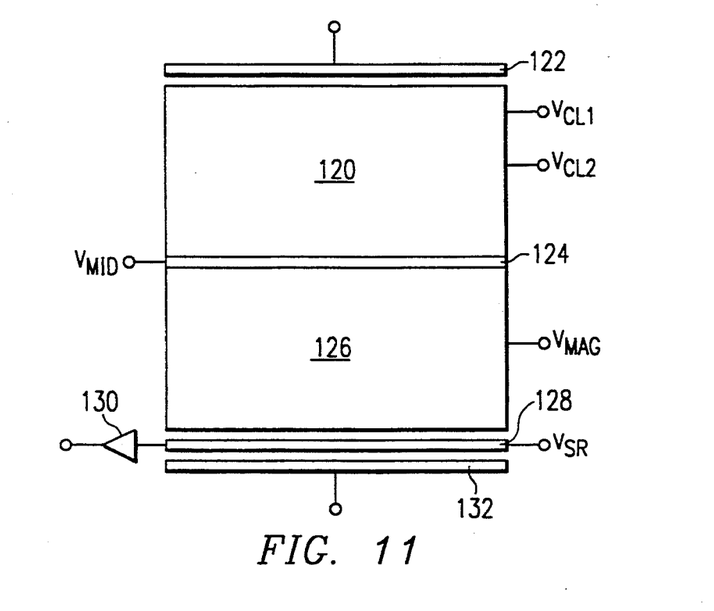
FIG. 11 is a topographical layout of a circuit incorporating the device FIG. 9 and the mid dump drain circuitry of the invention, and having a memory area and a serial output area for transferring the sensed charge data output.

The second preferred embodiment of FIG. 9 can be implemented into a sensor array as shown in FIG. 11. The operation of this array is similar to that described above for the first preferred embodiment in FIG. 6.

FIG. 11 depicts a topographical view of an image sensing device fabricated using the second preferred embodiment virtual phase CCD device of FIG. 9 in the image sensing area 120. The device is comprised of top drain 122, image sensing area 120, middle dump drain area 124, memory array area 126, serial register 128, charge detection amplifier 130, and bottom drain 132.

The image sensing area 120 is coupled to the two clock signals of FIG. 11, clocking voltages $V_{CL1}$ and $V_{CL2}$, which are coupled to the gate electrodes of alternating rows of pixel areas. During charge transfer to memory operations and charge clearing operations, the charge is moved down the columns by use of an out of phase clocking scheme.

Middle dump drain region 124 is used during charge clearing operations to remove the excess charge without effecting the memory area array CCD devices. When charge clearing operations are desired, a low potential is applied to the memory area gate $V_{MAG}$ so that as the charge arrives from the bottom row of pixels in image sensing area 120, charge is removed through the N+ electrodes of the mid dump drain coupled to the reference voltage signal $V_{MID}$. During charge transfer operations, where charge is being transferred to the memory area, the memory area gates are clocked out of phase with the last image area gate.

The electronic shutter feature of the second preferred embodiment in the array in FIG. 11 works basically the same as for the first preferred embodiment described above. One difference is that in this second embodiment, the gate voltages $V_{CL1}$ and $V_{CL2}$ are operated out of phase for both the charge clearing mode and for the charge transfer to memory mode, whereas for the first embodiment the gate voltages are operated in phase for the charge transfer to memory mode. The charge clearing feature is controlled by the voltage on the memory area gate $V_{MAG}$, as with the first preferred embodiment. When the memory area gate electrode is at a low voltage, the array is in the charge clearing mode and the charge from the image sensor is dumped into the mid dump drain. When the voltage applied to the memory area gate is alternating, the array is in the charge transfer mode and the charge from the image sensor array 120 is transferred to the memory array 126. This process is different than that for the first preferred embodiment because the two gate voltages $V_{CL1}$ and $V_{CL2}$ are operated out of phase for both the charge clearing function and for the charge transfer to memory function.

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An image sensing device with electronic shutter comprising:

a semiconductor substrate of a first conductivity type;

a buried channel layer of a second conductivity type disposed on the substrate;

virtual phase electrodes in the buried channel layer, the virtual phase electrodes having the first conductivity type, the virtual phase electrodes forming virtual gate potential areas in the substrate below the virtual phase electrodes;

an insulating layer on the substrate;

conductive electrodes disposed on the insulating layer and located over portions of the substrate between the virtual phase electrodes, the conductive electrodes forming clocked gate potential areas in the substrate below the conductive electrodes, the virtual gate potential areas and the clocked gate potential areas forming charge transfer columns along which charge can be transferred to an end of the charge transfer column;

a fast charge transfer mode wherein every other conductive electrode in a charge transfer column is clocked out of phase from the other conductive electrodes to provide fast charge transfer through the charge transfer column; and antiblooming electrodes disposed on the insulating layer and located between the conductive electrodes and spaced from the conductive electrodes and located over portions of the substrate between the virtual phase electrodes, the antiblooming gate is pulsed to remove over flow charge to reduce blooming.

2. The device of claim 1 wherein the antiblooming gate removes charge by electron-hole recombination.

3. An image sensing device with electronic shutter comprising:

a semiconductor substrate of a first conductivity type;

a buried channel layer of a second conductivity type disposed on the substrate;

virtual phase electrodes in the buried channel layer, the virtual phase electrodes having the first conductivity type, the virtual phase electrodes forming virtual gate potential areas in the substrate below the virtual phase electrodes;

an insulating layer on the substrate;

conductive electrodes disposed on the insulating layer and located over portions of the substrate between the virtual phase electrodes, the conductive electrodes forming clocked gate potential areas in the substrate below the conductive electrodes, the virtual gate potential areas and the clocked gate potential areas forming charge transfer columns along which charge can be transferred to an end of the charge transfer column;

a fast charge transfer mode wherein every other conductive electrode in a charge transfer column is clocked out of phase from the other conductive electrodes to provide fast charge transfer through the charge transfer column; and a slower charge transfer mode wherein every conductive electrode is clocked in phase allowing charge to be transferred through the charge transfer column while maintaining image information.

4. The device of claim 3 further comprising charge clearing drains located within the charge transfer columns.

5. An image sensing device with electronic shutter comprising:

a semiconductor substrate of a first conductivity type;

a buried channel layer of a second conductivity type disposed on the substrate;

virtual phase electrodes in the buried channel layer the virtual phase electrodes having the first conductivity type, the virtual phase electrodes forming virtual gate potential areas in the substrate below the virtual phase electrodes;

an insulating layer on the substrate;

conductive electrodes disposed on the insulating layer and located over portions of the substrate between the virtual phase electrodes, the conductive electrodes forming clocked gate potential areas in the substrate below the conductive electrodes, the virtual gate potential areas and the clocked gate potential areas forming charge transfer columns along which charge can be transferred to an end of the charge transfer column;

a fast charge transfer mode wherein every other conductive electrode in a charge transfer column is clocked out of phase from the other conductive electrodes to provide fast charge transfer through the charge transfer column; and an antiblooming feature wherein every other conductive electrode is pulsed while the other conductive electrodes are held at a low potential in order to provide antiblooming through electron-hole recombination.

6. The device of claim 5 wherein the conductive electrodes that are pulsed and the conductive electrodes that are held at a low potential are alternated in order to provide an interlace mode.

7. An image sensing array comprising:

an image sensing device with electronic shutter having:

a semiconductor substrate of a first conductivity type;

a buried channel layer of a second conductivity type disposed on the substrate;

virtual phase electrodes in the buried channel layer, the virtual phase electrodes having the first conductivity type, the virtual phase electrodes forming virtual gate potential areas in the substrate below the virtual phase electrodes;

an insulating layer on the substrate;

conductive electrodes disposed on the insulating layer and located over portions of the substrate between the virtual phase electrodes, the conductive electrodes forming clocked potential areas in the substrate below the conductive electrodes, the virtual gate potential areas and the clocked gate potential areas forming charge transfer columns along which charge can be transferred to an end of the charge transfer column;

a fast charge transfer mode wherein every other conductive electrode in a charge transfer column is clocked out of phase from the other conductive electrodes to provide fast charge transfer through the charge transfer column for providing the electronic shutter;

a slower charge transfer mode wherein every conductive electrode is clocked in phase allowing charge to be transferred through the charge transfer column while maintaining image information; and a memory device coupled to the image sensing device for receiving charge from the image sensing device.

8. The device of claim 7 wherein the memory device is coupled to the end of the charge transfer column.

9. The device of claim 8 further comprising a charge clearing drain coupled to the end of the charge transfer column.

10. The device of claim 9 wherein charge from the charge transfer column is transferred to the charge clearing drain to clear the charge from the image sensing device when a potential barrier is formed at an interface of the memory device, charge from the charge transfer column is transferred to the memory device when the potential barrier is not formed.

11. The device of claim 7 further comprising:

a top drain coupled to an end of the image sensing device;

a bottom drain coupled to an end of the memory device; and a shift register coupled to the end of the memory device for shifting charge to a charge detection amplifier.

12. A method for detecting an image comprising:

collecting electrical charge carriers responsive to incident light in an image area array;

transferring the electrical charge carriers from the image area array to a charge drain by clocking image area gates out of phase; and transferring the electrical charge carriers from the image area array to a memory array by clocking the image area gates in phase.

13. The method of claim 12 further comprising shifting the electrical charge carriers from the memory array into a shift register one row at a time.

14. The method of claim 13 further comprising shifting the electrical charge carriers from the shift register to a charge detection node one pixel at a time.

15. The method of claim 12 further comprising clocking antiblooming gates in the image area array to reduce blooming.

16. A method for detecting an image comprising:

collecting electrical charge carriers responsive to incident light in an image area array;

transferring the electrical charge carriers from the image area array to a charge drain by clocking image area gates out of phase;

transferring the electrical charge carriers from the image area array to a memory array by clocking the image area gates out of phase; and clocking every other image area gate while applying a low potential to other image area gates to reduce blooming.

* * * * *